United States Patent [19]

Okuda et al.

[11] Patent Number: 5,001,521
[45] Date of Patent: Mar. 19, 1991

[54] SEMICONDUCTOR SUBSTRATE INCLUDING STRAINED LAYER SUPERLATTICE STRUCTURE LAYER

[75] Inventors: Hiroshi Okuda; Mitsuru Sugawara, both of Atsugi, Japan

[73] Assignee: Fujitsu Ltd., Kawasaki, Japan

[21] Appl. No.: 316,735

[22] Filed: Feb. 28, 1989

[30] Foreign Application Priority Data

Mar. 1, 1988 [JP] Japan ............................... 63-045819

[51] Int. Cl.$^5$ ..................... H01L 27/12; H01L 45/00; H01L 49/02; H01L 29/61
[52] U.S. Cl. .......................................... 357/4; 357/16; 357/88; 357/90
[58] Field of Search ......................... 357/4, 16, 88, 90

[56] References Cited

U.S. PATENT DOCUMENTS

| | | | |
|---|---|---|---|
| 4,053,920 | 10/1977 | Enstrom | 357/16 |
| 4,088,515 | 5/1978 | Blakeslee et al. | 357/88 |
| 4,195,305 | 3/1980 | Moon | 357/88 |
| 4,558,336 | 12/1985 | Chang et al. | 357/88 |
| 4,607,272 | 8/1986 | Osbourn | 357/4 |
| 4,788,579 | 11/1988 | Couch et al. | 357/4 |
| 4,794,611 | 12/1988 | Hara et al. | 357/4 |

FOREIGN PATENT DOCUMENTS

88/01792  3/1988  World Int. Prop. O. ............. 357/4

OTHER PUBLICATIONS

Sze, Semiconductor Devices: Physics and Tech., ©1985, FIG. 16.
Lee et al., High Quality InGaAs Schottky Diode Formed by Graded Superlattice of InGaAs/InAlAs, 5-8-89, 1863-1864.
Blakeslee, Vapor Phase Expitaxial Deposition Process for Forming Superlattice Structure, 7-1971, 539-541.
"Interactions of Dislocations in GaAs Grown on Si Substrates with InGaAs-GaAsP Strained Layered Superlattices", El-Masry et al., J. Appl. Phys., 64 (7), Oct. 1, 1988, pp. 3672-3677.
"Heteroepitaxial Growth of III-V Compounds on Si by MOCVD", Soga et al., Ints. Phys. Conf. Ser. No. 79: Chapter 3, 1985, pp. 133-137.
"Low-Threshold Operation of AlGaAs/GaAs Multiple Quantum Well Lasers Grown on Si Substrates by Molecular Beam Epitaxy", Chong et al., Appl. Phys. Lett., 51 (4), Jul. 27, 1987, pp. 221-223.
"Defects in Expitaxial Multilayers", Matthews et al., Journal of Crystal Growth, No. 32 (1976), pp. 265-273.
"Defect Reduction in GaAs Epilayers on Si Substrates Using Strained Layer Superlattices", El-Masry et al., Mat. Res. Soc. Symp. Proc., vol. 91, 1987, pp. 99-103.
Japanese Journal of Applied Physics, vol. 21, No. 6, Jun. 1982, pp. L323-L325.
Journal of Crystal Growth, 58 (1982), pp. 194-202.

Primary Examiner—Andrew J. James
Assistant Examiner—Daniel Kim
Attorney, Agent, or Firm—Armstrong, Nikaido, Marmelstein, Kubovcik & Murray

[57] ABSTRACT

A semiconductor substrate comprising: a single-crystalline semiconductor wafer substrate; a strained layer superlattice (SLS) structure layer formed on the wafer substrate; and a compound semiconductor epitaxial layer formed on the SLS structure layer. According to the present invention, the SLS structure layer consists of pairs of a first compound semiconductor thin layer and a second compound semiconductor thin layer, the first and second thin layers having the same components in a compound system having a miscibility gap, and having different compositions outside of the miscibility gap including the limit line of the miscibility gap, respectively, at a temperature higher than that of heat-treatments applied to the compound semiconductor substrate, without a decay of the SLS structure.

12 Claims, 4 Drawing Sheets

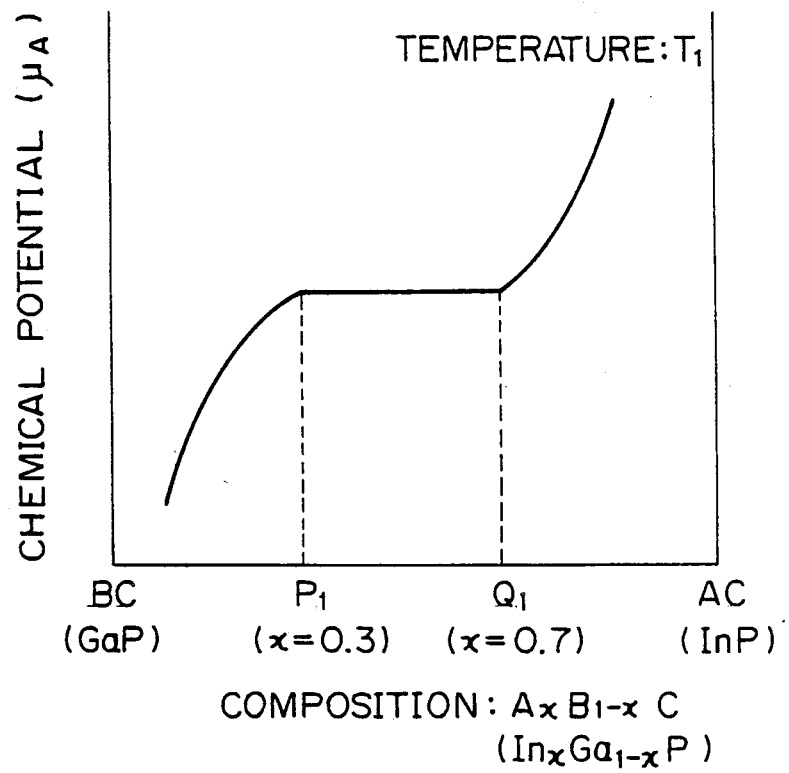

SEMICONDUCTOR SUBSTRATE INCLUDING STRAINED LAYER SUPERLATTICE STRUCTURE LAYER

BACKGROUND OF THE INVENTION

1. Field of the Invention

The present invention relates to a semiconductor substrate for a production of semiconductor transistor devices or photoelectronic devices, and more particularly, to a semiconductor substrate comprising a single-crystalline semiconductor wafer substrate, a compound semiconductor epitaxial layer, and a strained layer superlattice (SLS) structure layer between the wafer layer and the epitaxial layer.

2. Description of the Related Art

An SLS structure layer is formed as a buffer layer between the semiconductor wafer substrate, such as a GaAs wafer and Si wafer, and a compound semiconductor layer, such as an InGaP layer and GaAs layer, for the following reasons:

(1) The SLS buffer layer reduces dislocations in the grown compound semiconductor layer by preventing an extension of threading dislocations from the substrate into the compound semiconductor layer, due to the strain field in the SLS; and (2) The SLS buffer layer allows an epitaxial growth of the compound semiconductor layer having a different lattice constant from that of the substrate by absorbing a lattice mismatch due to an alternate expansion and contraction of strained thin layers of the SLS structure layer.

For example, a GaAs grown on a Si (GaAs/Si) substrate instead of a single-crystalline GaAs wafer substrate is produced by using the SLS structure layers to enlarge the wafer size, increase the mechanical strength and thermal conductivity, and reduce costs, compared with the GaAs wafer substrate, a lattice constant of GaAs being larger than that of Si by about 4% (e.g., cf. N.El-Masry et al, "Defect Reduction in GaAs Epilayers on Si Substrate Using Strained Layer Superlattices", Mat. Res. Soc. Sympo. Porc. Vol. 91, 1987, pp. 99–103). Furthermore, it is often necessary to form (grow) a compound semiconductor layer having a different or a same lattice constant from or as that of the wafer substrate for light emitting devices or lasers having a desired emission wavelength, while reducing the number of crystal defects such as dislocations.

Currently, there is a tendency to overestimate the SLS buffer. Namely, in practice, although an SLS buffer uses a pair of compound semiconductor layers having a large lattice mismatch therebetween, a compound semiconductor epitaxial layer growth on the SLS buffer has a high density of dislocations larger than that of a wafer substrate, by five or six fold, and when a graded layer is additionally grown between the wafer substrate and the SLS buffer, the compound semiconductor epitaxial layer also has a high density of dislocations. Therefore, the effect of reducing the number of dislocations in the SLS buffer is very low.

To obtain a required dislocation reducing effect, preferably the compound semiconductor substrate including the SLS buffer is heat-treated at a high temperature (i.e., an annealing out of excessive dislocations).

A conventional SLS buffer, however, is not proof against a heat-treatment (annealing) at a high temperature, ever for a short time, and a decay of the SLS structure by an interdiffusion of the alternating thin layers thereof occurs. Therefore, although the number of dislocations is reduced, the decay of the SLS structure causes variations in the characteristics of the devices, for example, an increase of a full-width at a half maximum (FWHM) of an LED, and prevents further annealing or thermal cycling improvement.

SUMMARY OF THE INVENTION

An object of the present invention is to provide an improved strained layer superlattice (SLS) structure layer (buffer) which is not deformed (interdiffused) by a heat-treatment at a high temperature, including annealing for reducing the number of dislocations, heating for an epitaxial growth of an additional compound semiconductor layer, or annealing after ion-implantation.

Another object of the present invention is to provide a semiconductor substrate comprising a single-crystalline semiconductor wafer substrate, a compound semiconductor epitaxial layer, and the improved SLS structure layer interposed between the wafer substrate and the epitaxial layer.

These and other objects of the present invention are obtained by providing a semiconductor substrate comprising: a single-crystalline semiconductor wafer substrate; an SLS structure layer formed on the wafer substrate; and a compound semiconductor epitaxial layer formed on the SLS structure layer. According to the present invention, the SLS structure layer comprises pairs of a first compound semiconductor thin layer and a second compound semiconductor thin layer, the first and second thin layers having the same components in a compound system having a miscibility gap, and having different compositions outside of the miscibility gap including the limit line of the miscibility gap, respectively, at a temperature higher than that of heat-treatments applied to the semiconductor substrate. It is preferable that such the temperature difference is 10° C. or more.

The wafer substrate is composed of a compound semiconductor (e.g., GaAs, InP, GaSb, GaP, InAs) or of silicon (Si).

BRIEF DESCRIPTION OF THE DRAWINGS

The present invention will be more apparent from the description of the preferred embodiments set forth below, with reference to the accompanying drawings, in which:

FIG. 2 is a graph showing a relationship between a composition of the ABC (InGaP) and a chemical potential of A (In) at a temperature $T_1$;

DESCRIPTION OF THE PREFERRED EMBODIMENTS

According to the present invention, an SLS structure is thermally stabilized by utilizing a miscibility gap in a ternary or quaternary compound semiconductor system determining the alternating first and second compound semiconductor thin layers.

Figure 1:
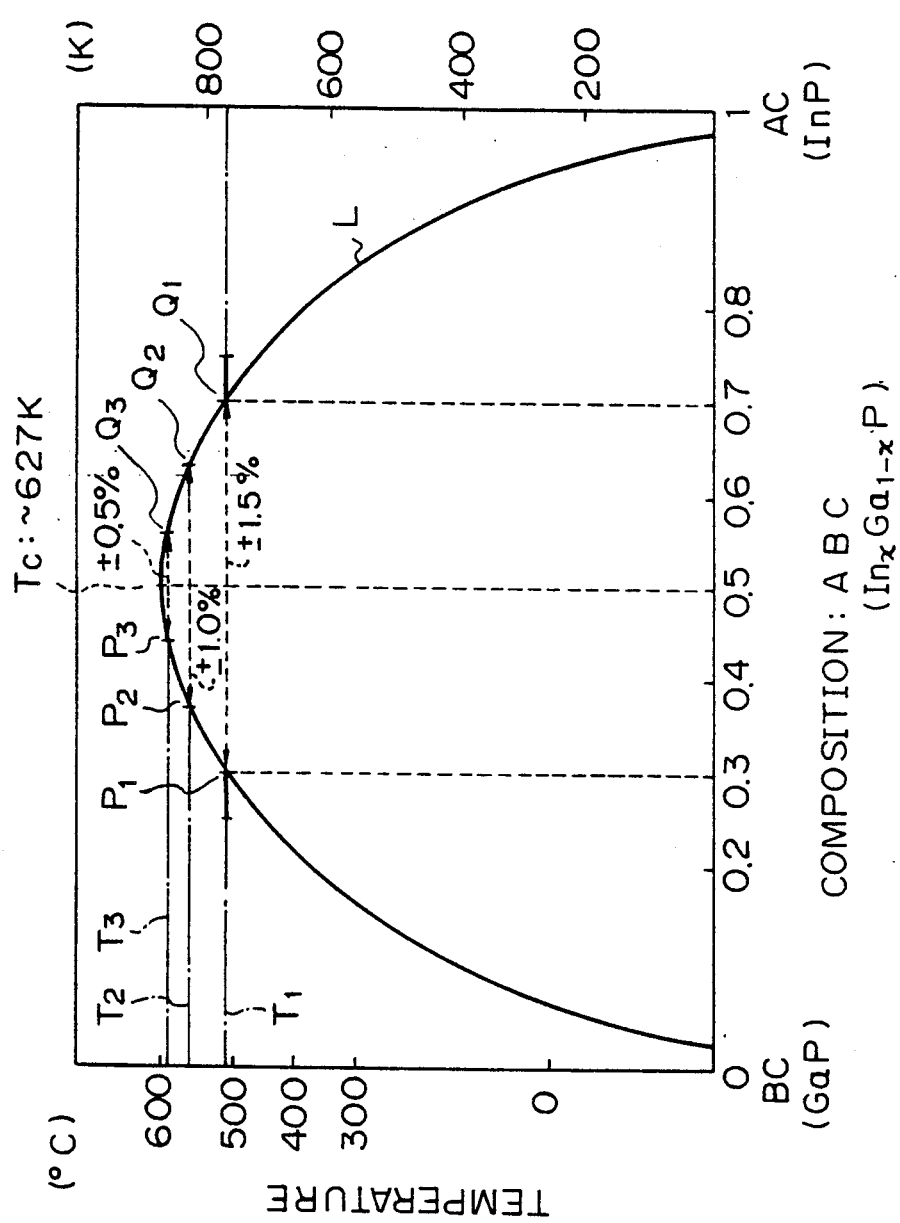
FIG. 1 is a pseudo-binary phase diagram of an ABC ($In_xGa_{1-x}P$) system of BC (GaP)—AC (InP)

FIG. 1 shows a pseudo-binary phase diagram of a ternary ABC (e.g., $In_xGa_{1-x}P$) system at a combination of BC (III-V compound semiconductor, e.g., GaP) and AC (another III-V compound semiconductor, e.g., InP). The abscissa and ordinate of FIG. 1 indicate a ratio of "x" of component A (In) of the composition and a temperature, respectively. In FIG. 1, points $P_1$ ($P_2$, $P_3$) and $Q_1$ ($Q_2$, $Q_3$) are limited values of a complete solid solution state at a temperature $T_1$, ($T_2$, $T_3$), between the points $P_1$ ($P_2$, $P_3$) and $Q_1$ ($Q_2$, $Q_3$) of a miscibility gap region. A solid line L is a critical value, and the miscibility gap region is inside the line L. For example, in the $In_xGa_{1-x}P$ system points $P_1$, $P_2$, $P_3$ and $Q_1$, $Q_2$, $Q_3$ indicate the following compositions, at temperatures $T_1$, $T_2$ and $T_3$, and a degree of mismatch (strain value ($\Delta a$) with the lattice constant (a) of $In_{0.5}Ga_{0.5}P$:

$T_1 = 510°$ C.: $\quad P_1 = In_{0.3}Ga_{0.7}P$ $\Delta a/a = \pm 1.5\%$: $\quad Q_1 = In_{0.7}Ga_{0.3}P$ $T_2 = 560°$ C.: $\quad P_2 = In_{0.37}Ga_{0.63}P$ $\Delta a/a = \pm 1.0\%$: $\quad Q_2 = In_{0.63}Ga_{0.47}P$ $T_3 = 590°$ C.: $\quad P_3 = In_{0.43}Ga_{0.57}P$ $\Delta a/a = \pm 0.5\%$: $\quad Q_3 = In_{0.57}Ga_{0.43}P$ The maximum temperature Tc of the miscibility gap is about 630° C.

A GaPSb system and InGaAsP system can be adopted instead of the InGaP system.

A chemical potential $\mu A$ of component A (In) at a temperature $T_1$ varies, as shown in FIG. 2. The abscissa and ordinate of FIG. 2 indicate a composition ABC ($In_xGa_{1-x}P$) and the chemical potential, respectively.

The decay of the SLS structure due to a high temperature heat-treatment is caused by an interdiffusion of elements of each of the compound semiconductor thin layers. When a gradient of the characteristic curve of the chemical potential exists, the gradient generates this interdiffusion, but between the points $P_1$ and $Q_1$, the gradient is zero; namely, the following formula is valid and thus the interdiffusion does not occur.

$$\frac{\partial \mu_A}{\partial A_x} \approx \frac{\Delta \mu_A}{\Delta A_x} = 0$$

Therefore, if the SLS structure is formed of compound semiconductor thin layers having a composition at $P_1$ or its vicinity outside of the miscibility gap and the other compound semiconductor thin layers having another composition at $Q_1$ or its vicinity outside the miscibility gap, which are alternately piled on each other, the SLS structure is extremely thermodynamically stable against a heat-treatment at a temperature $T_1$, and thus the SLS structure is not decayed. For example, the SLS structure consisting of $In_{0.3}Ga_{0.7}P$ thin layers and $In_{0.7}Ga_{0.3}P$ thin layers withstands temperatures upto 500° C. If a temperature of the heat-treatment is 550° C., the SLS structure should be formed of $In_{0.37}Ga_{0.63}P$ thin layers and $In_{0.63}Ga_{0.37}P$ thin layers.

Note, the GaAsSb system of GaAs-GaSb or InGaAs system of GaAs-InAs can be used for an SLS structure utilized in the growth of an epitaxial InP layer, since these systems have pseudo-binary phase diagrams similar to that of FIG. 1.

The $GaAs_{1-x}Sb_x$ system has the following data:

$T_1 \approx 770°$ C. $\quad P_1 = GaAs_{0.7}Sb_{0.3}$ $\Delta a/a = 1.5\%$ $\quad Q_1 = GaAs_{0.3}Sb_{0.7}$ $T_2 \approx 790°$ C. $\quad P_2 = GaAs_{0.63}Sb_{0.37}$ $\Delta a/a = \pm 1.0\%$ $\quad Q_2 = GaAs_{0.37}Sb_{0.63}$ $T_3 \approx 820°$ C. $\quad P_3 = GaAs_{0.566}Sb_{0.434}$ $\Delta a/a = 0.5\%$ $\quad Q_3 = GaAs_{0.434}Sb_{0.566}$ $Tc \approx 830°$ C.

Note: $\Delta a/a$ indicates a degree of mismatch (strain value) "$\Delta a$" of $GaAs_{1-x}Sb_x$ with the lattice constant "a" of $GaAs_{0.5}Sb_{0.5}$.

The $In_xGa_{1-x}As$ system has the following data:

$T_1 \approx 580°$ C. $\quad P_1 = In_{0.72}Ga_{0.28}As$ $\Delta a/a = \pm 1.5\%$ $\quad Q_1 = In_{0.28}Ga_{0.72}As$ $T_2 \approx 600°$ C. $\quad P_2 = In_{0.65}Ga_{0.35}As$ $\Delta a/a = \pm 1.0\%$ $\quad Q_2 = In_{0.35}Ga_{0.65}As$ $T_3 \approx 620°$ C. $\quad P_3 = In_{0.57}Ga_{0.43}As$ $\Delta a/a = \pm 0.5\%$ $\quad Q_3 = In_{0.43}Ga_{0.57}As$ $Tc \approx 630°$ C.

Note: $\Delta a/a$ indicates a degree of mismatch "$\Delta a$" of $In_xGa_{1-x}As$ with the lattice constant of $In_{0.5}Ga_{0.5}As$. $In_{0.47}Ga_{0.53}As$ has the same lattice constant as that of InP.

Note: $\Delta a/a$ indicates a degree of mismatch "$\Delta a$" of $In_xGa_{1-x}As$ with the lattice constant of $In_{0.5}Ga_{0.5}As$. $In_{0.47}Ga_{0.53}As$ has the same lattice constant as that of InP.

Preferably the GaAsSb system is adopted, because the SLS structure of the GaAsSb system can withstand higher temperatures than the InGaAs system.

EXAMPLE 1

Figure 3A:
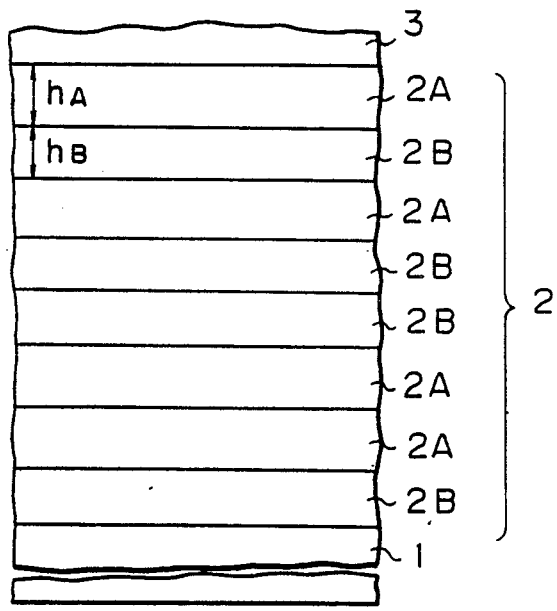
FIG. 3A is a fragmented sectional view of a semiconductor substrate according to the present invention.
Figure 3B:
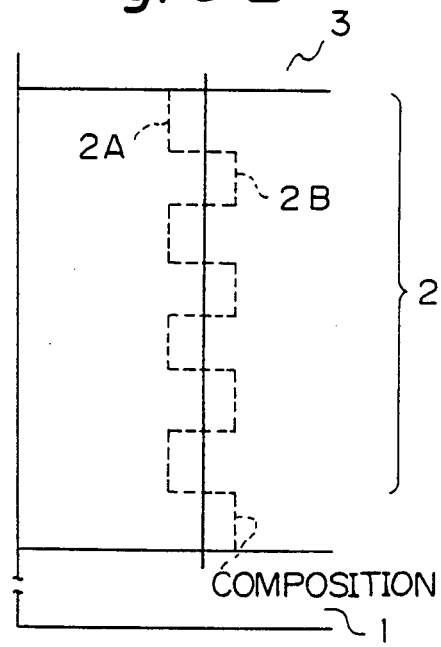
FIG. 3B is a graph of a lattice constant and a composition variation of the substrate of FIG. 3A.

Referring to FIGS. 3A and 3B, a semiconductor substrate according to the present invention consists of a single-crystalline GaAs wafer substrate 1, an SLS structure layer formed of $In_{0.7}Ga_{0.3}P$ thin layers 2A having a constant thickness, and $In_{0.3}Ga_{0.7}P$ thin layers 2B having a constant thickness, and an epitaxial $In_{0.51}Ga_{0.49}P$ layer 3 having the same lattice constant as that of the GaAs wafer substrate 1.

In this case, a degree of mismatch (strain value) $\Delta a$ of the thin layers 2A and 2B to the lattice constant of $In_{0.5}Ga_{0.5}P$, is +1.5%. Each of the thin layers 2A and 2B has a thickness of from 5 to 30 nm. Note, the thickness of the individual thin layers should be below the maximum critical thickness to self-generate misfit dislocations.

In the SLS structure a lattice constant "$a_{||}$" of the individual thin layer in a face parallel to the wafer substrate surface is determined by the following formula:

$$a_{||} = \frac{a_A G_A h_A + a_B G_B h_B}{G_A h_A + G_B h_B}$$

wherein $a_A$ and $a_B$ are unstrained lattice constants of the thin layers 2A and 2B, respectively;

$h_A$ and $h_B$ are thicknesses of the thin layers 2A and 2B, respectively; and, $G_A$ and $G_B$ are rigidities of the thin layers 2A and 2B, respectively.

Therefore, possibly the lattice constant "$a_{11}$" of the SLS structure is controlled by ensuring that the ratio ($h_A/h_B$) of the thickness of the thin layer 2A to that of the thin layer 2B, coincides with that of the wafer substrate 1, as shown in FIG. 3B.

Therefore, the lattice constant "$a_{11}$" of the ten-period $In_{0.3}Ga_{0.7}P$ (10.5 nm) − $In_{0.7}Ga_{0.3}P$ (9.5 nm) SLS structure layer becomes equal to that of the GaAs wafer substrate, in which $h_A/h_B$ is about 21/19.

After the formation of the SLS structure layer 2, the $In_{0.51}Ga_{0.49}P$ layer 3 is epitaxially grown under the condition that the lattice constant of the layer 3 is equal to that of the SLS structure layer 2, as shown in FIG. 3B.

Next, the obtained compound substrate is annealed, to reduce the number of dislocations, at a temperature of 500° C. The annealing reduces the number of dislocations, and thus stabilizes the SLS structure without decay.

The AlGaInP lower clad layer, GaInP active layer, AlGaInP upper clad layer, and GaAs cap layer are epitaxially and successively grown on the obtained compound semiconductor substrate (i.e., the $In_{0.51}Ga_{0.49}P$ layer 3) to produce an LED having an emission wavelength of about 650 nm.

EXAMPLE 2

Figure 4A:
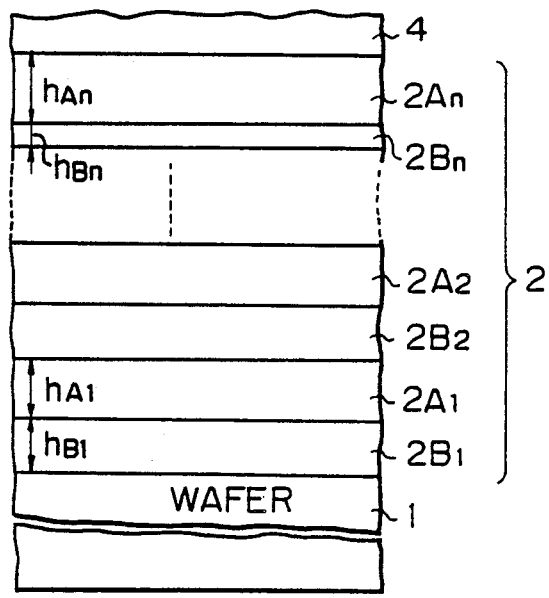
FIG. 4A is a fragmented sectional view of another semiconductor substrate according to the present invention.
Figure 4B:
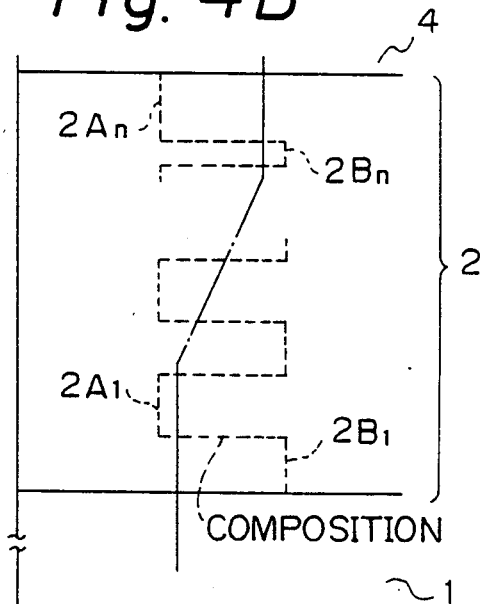
FIG. 4B is a graph of a lattice constant variation and composition variation of the substrate of FIG. 4A.

Referring to FIGS. 4A and 4B, another compound semiconductor substrate according to the present invention consists of the GaAs wafer substrate 1, an SLS structure layer 2 formed of $In_{0.3}Ga_{0.7}P$ thin layers $2A_1$, $2A_2 \ldots 2A_n$ and $In_{0.7}Ga_{0.3}P$ thin layers $2B_1$, $2B_2 \ldots 2B_n$, and an epitaxial $In_{0.4}Ga_{0.6}P$ layer 4 having a shorter lattice constant than that of the GaAs wafer substrate 1.

To change the lattice constant "$a_{11}$" of the SLS structure layer from that of GaAs to that of $In_{0.4}Ga_{0.6}P$, as shown in FIG. 4B, a ratio of thickness $h_{A1}$ ($h_{A2} \ldots h_{An}$) of the thin layer $2A_1$ ($\ldots 2A_n$) to that $h_{B1}$ ($h_{B2} \ldots B_n$) of the thin layer $2B_1$ ($\ldots 2B_n$) of each pair of thin layers is gradually varied as follows:

$$\frac{h_{A1}}{h_{B1}} < \frac{h_{A2}}{h_{B2}} < \frac{h_{A3}}{h_{B3}} < \ldots < \frac{h_{An}}{h_{Bn}}$$

For example, the ten-period $In_{0.3}Ga_{0.7}P$ (10.5 to 15 nm) − $In_{0.7}Ga_{0.3}P$ (9.5 to 5 nm) SLS structure layer (in which $h_{A1}/h_{B1}=21/19$, $h_{A10}/h_{B10}=3/1$ and one period thickness of 20 nm=constant) is suitable. The $In_{0.4}Ga_{0.6}P$ layer 4 is epitaxially grown on the obtained SLS structure layer 2 to coincide the lattice constant of the layer 4 with the varied lattice constant "$a_{11}$" of the layer 2, as shown in FIG. 4B.

The obtained substrate is then annealed at 500° C. to reduce the number of dislocations and stabilize the SLS structure without decay.

The $In_xGa_{1-x}P$, wherein "x" is smaller than 0.3 and is gradually reduced, can be used for the thin layers $2A_1$, $2A_2 \ldots 2A_n$ under the condition of $h_{A1}/h_{B1} = h_{A2}/h_{B2} = \ldots \mu h_{An}/h_{Bn}$, instead of the above-mentioned thickness ratio variation. In this case, the value "x" is from 0.3 to the minimum critical value, to self-create misfit dislocations.

EXAMPLE 3

Figure 5A:
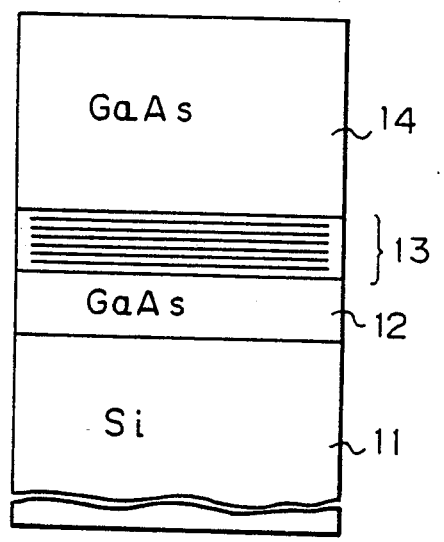
FIG. 5A is a fragmented sectional view of a GaAs/Si substrate according to the present invention.
Figure 5B:
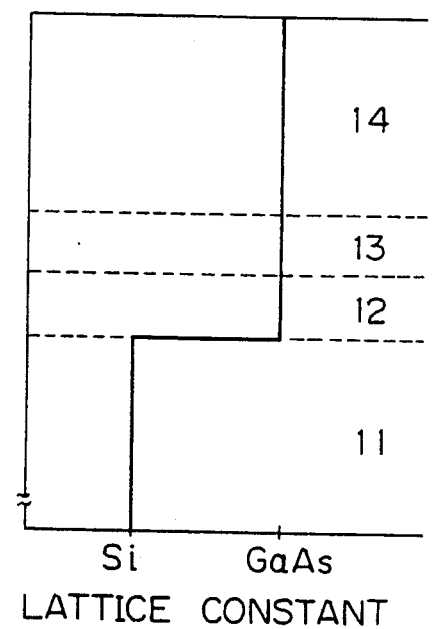
FIG. 5B is a graph of a lattice constant variation of the substrate of FIG. 5A.

Referring to FIGS. 5A and 5B, still another semiconductor substrate according to the present invention consists of a single-crystalline silicon (Si) wafer substrate: 11, a GaAs buffer layer 12, an SLS structure layer 13 of the ten-period $In_{0.37}Ga_{0.63}P$ (9.2 nm) − $In_{0.63}Ga_{0.37}P$ (10.8 nm), and a GaAs epitaxial layer 14.

The GaAs buffer layer 12 of amorphous is deposited on the Si wafer substrate 11 by a conventional MOCVD process. Note, a graded GaAs buffer layer also can be formed. Then, the SLS structure layer 13 consisting of $In_{0.37}Ga_{0.63}P$ thin layers and $In_{0.63}Ga_{0.37}P$ thin layers is formed on the GaAs buffer layer 12 by a MOCVD process to provide the lattice constant "$a_{11}$" which is equal to that of GaAs, as shown in FIG. 5B. Next, the GaAs epitaxial layer 14 is grown on the SLS structure layer 13 to obtain a GaAs/Si substrate.

The obtained semiconductor (GaAs/Si) substrate is annealed at about 600° C. to reduce the number of dislocations without a decay of the SLS structure.

As described above, according to the present invention, each pair of compound semiconductor thin layers of the SLS structure layer has compositions at both limit positions or the vicinity of the miscibility gap at a temperature corresponding to that of a heat-treatment, so that temperature (or below) does not affect the SLS structure. Therefore, suitable heat-treatments (annealing, etc.) can be applied to the obtained semiconductor substrate to reduce the number of dislocations, without a decay of the SLS structure. It is preferably that the difference between a miscibility gap temperature and a heat-treatment temperature is 10° C. or more, since the compositions of the thin layers of the SLS structure layer may vary due to growth condition variability.

It will be obvious that the present invention is not restricted to the above-mentioned embodiments and that many variations are possible for persons skilled in the art without departing from the scope of the invention.

We claim:

1. A semiconductor substrate comprising: a single-crystalline semiconductor wafer substrate; a strained layer superlattice structure layer formed on said wafer substrate; and a compound semiconductor epitaxial layer formed on said strained layer superlattice structure layer; characterized in that said strained layer superlattice structure layer comprises pairs of a first compound semiconductor thin layer and a second compound semiconductor thin layer, said first and second semiconductor thin layers consisting of the same components in a compound system and having different compositions, which compositions substantially correspond to two compositions at the limited values of solid solution states, respectively, at a prescribed temperature not lower than an annealing temperature applied to said compound semiconductor substrate.

2. A semiconductor substrate according to claim 1, wherein said wafer substrate is composed of a compound semiconductor.

3. A semiconductor substrate according to claim 2, wherein said compound semiconductor is selected from the group consisting of GaAs, InP, GaP, GaSb, and InAs.

4. A semiconductor substrate according to claim 1, wherein said wafer substrate is composed of silicon.

5. A semiconductor substrate according to claim 1, wherein a lattice constant of said epitaxial layer is equal to that of said wafer substrate.

6. A semiconductor substrate according to claim 1, wherein a lattice constant of said epitaxial layer is different from that of said wafer substrate.

7. A semiconductor substrate according to claim 5, wherein a ratio of the thickness of said first thin layer to that of said second thin layer is constant.

8. A semiconductor substrate according to claim 6, wherein a ratio of the thickness of said first thin layer to that of said second thin layer is gradually varied.

9. A semiconductor substrate according to claim 6, wherein a ratio of the thickness of said first thin layer to that of said second thin layer is constant, and the composition of one of said first and or second thin layer is gradually varied.

10. A semiconductor substrate according to claim 3, wherein said wafer substrate is composed of GaAs, said epitaxial layer is composed of InGaP, and said first and second thin layers are composed of compounds in a GaP-InP system.

11. A semiconductor substrate according to claim 4, wherein said compound semiconductor substrate further comprises a GaAs buffer layer on said silicon wafer substrate, said epitaxial layer is composed of GaAs, and said first and second thin layers are composed of compounds selected from the group consisting of InP-GaP system, GaP-GaSb system and GaP-InAs system.

12. A semiconductor substrate according to claim 1, wherein the difference between said prescribed temperature and the heat-treatment temperature is 10° C. or more.

* * * * *